(12) United States Patent
Chickermane et al.

(10) Patent No.: US 7,779,381 B2
(45) Date of Patent: Aug. 17, 2010

(54) TEST GENERATION FOR LOW POWER CIRCUITS

(75) Inventors: Vivek Chickermane, Ithaca, NY (US);
James Sage, Kirkwood, NY (US);
Patrick Gallagher, Apalachin, NY (US);
Xiaochuan Yuan, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 906 days.

(21) Appl. No.: 11/519,381

(22) Filed: Sep. 11, 2006

(65) Prior Publication Data
US 2008/0071513 A1    Mar. 20, 2008

(51) Int. Cl.
*G06F 17/50* (2006.01)
(52) U.S. Cl. .................... 716/17; 716/1; 703/14
(58) Field of Classification Search .......... 716/1, 716/17
See application file for complete search history.

(56) References Cited

U.S. PATENT DOCUMENTS 5,561,614 A * 10/1996 Revilla et al. ............... 702/120
5,592,493 A * 1/1997 Crouch et al. ............... 714/729
6,687,883 B2 * 2/2004 Cohn et al. ..................... 716/4
6,779,163 B2   8/2004 Bednar et al.
6,820,240 B2  11/2004 Bednar et al.
6,883,152 B2   4/2005 Bednar et al.

* cited by examiner

*Primary Examiner*—Thuan Do
(74) *Attorney, Agent, or Firm*—Schwegman, Lundberg & Woessner, P.A.

(57) ABSTRACT

In the field of integrated circuit design and testing, especially directed towards integrated circuits intended to operate at low power, a method and system are provided for circuit design and simulation and testing for mapping portions of a circuit, such as a power domain or portion of a power domain, to a test mode. Thereby only those portions of the circuit which need to be powered up in a particular test mode are powered up both in the design (simulation) phase and in the actual testing. This conserves power usage during actual testing as against powering up all portions of the circuit, which is not desirable during the testing of the circuit after manufacture. This ensures that the power conditions required to excite and observe any circuit faults during testing exist for the power conditions that are applied during, for instance, manufacturing testing. By automatically partitioning the faults to remove those that cannot be excited or observed during manufacturing and testing, the testability of the device in terms of its partitions or parts will accurately reflect the power state of the logic portions of the circuit.

19 Claims, 6 Drawing Sheets

TEST GENERATION FOR LOW POWER CIRCUITS

FIELD OF THE INVENTION

The present invention relates to the field of electronic design automation (EDA). In particular, the present invention relates to methods and systems for simulating and testing low power electronic circuits, such as integrated circuits (IC).

BACKGROUND

With the rapid growth of wireless and portable consumer electronic devices, there have been increasing demands for new technological advancements with more functions in battery-operated systems. This phenomenon has resulted in increasing design and verification challenges for low-power (low electric power consumption) applications.

The challenges include minimizing leakage power dissipation, designing efficient packaging and cooling systems for high-power integrated circuits, and verifying functionalities of low-power or no power situations early in the circuit design process. Such power management issues become even more critical in view of the continuous shrinking of device (transistor) dimensions with the next generation of semiconductor processing technology. Addressing such power management issues is critical in the integrated circuit design process for portable consumer electronic devices.

Existing power optimization and implementation techniques are typically applied at the physical implementation phase of the I.C. design process. Certain power management techniques can only be implemented at the physical level after circuit synthesis. These power management design techniques may significantly change the design intent, yet none of the intended behavior can now be captured in the RTL (Register Transfer Language) version of the design. This deficiency creates a gap in the RTL to Graphic Data System II (GDSII) implementation and verification flow where the original RTL can no longer be relied upon as a correct representation of the design, and thus cannot be used to verify the final netlist implementation containing power management implementations.

Therefore, there is a need for incorporating power information of the circuit to address the deficiencies of the existing design methodologies in the design process and especially as applicable to circuit testing. Specifically, there is a need for incorporating power information in the design process and applying the power information to the entire design flow of verification, validation, synthesis, test, physical synthesis, routing, analysis and signoff tool. In particular, there is a need to ensure that other portions of the integrated circuit are functional when one or more power domains are powered down, e.g. in an RTL design environment.

In more detail, in the state of the art integrated circuits typically have one or more designated test modes for manufacturing testing. This manufacturing testing typically is done at the wafer stage when the integrated circuits are still each a die in a full silicon wafer. Of course the tests can be applied after the wafer has been diced and even after the individual die have been packaged in integrated circuits. However it is typically performed early. This particular type of manufacturing testing is normally directed towards finding faulty circuit elements such as opens, shorts, or faulty transistors, but is not so limited.

In the actual circuit testing there are important power considerations for ICs which are intended to operate at low power such as in battery operated or other applications wherever power consumption is an issue. The common power format (CPF) further referred to below is a software design tool being introduced in the electronic design field for design and simulation of such low power circuits. Not only during operation but also during testing, power consumption is an issue for several reasons. First, the test equipment (ATE, automatic test equipment) normally used in the industry can only handle limited amounts of power being sourced or sunk from a particular wafer or a die. Hence the typical prior art approach in the test mode of having the integrated circuit or die fully powered up for testing is not practical. Further there is the issue of power droop, which is current-resistance drop at high applied power, which also interferes with testing. This testing typically involves what is called in the field ATPG or automatic pattern test generation, for applying test signals (vectors) to the device under test.

SUMMARY

Therefore in accordance with the invention there is provided a method for mapping or associating various power modes of the circuit to the test mode. Power modes are described more below, but generally this refers to particular portions of an integrated circuit being powered up or down. (Power down of course is the same as power being off.) In this case power always refers to supply of electrical power. The various partitions or portions of the chip which are powered on or off are referred to generally as power domains, also further described below. Each portion may operate at a different operating voltage than any other portion to which it is electrically connected. A chip (IC) may have a number of power modes in which various power domains are powered up or down, typically independently. A typical chip (IC or die) has 2 to 16 or more such domains and hence from 3 to 64,000 power modes.

In accordance with the invention, the power modes are mapped during IC design to the test configurations or test modes. This allows one later to test systematically the different power modes when the chip is actually being tested (the physical test) without having the problems of excess heat which might damage the die or wafer under test and without the power droop issue. Hence it is important not only to test the chips in this way but they also must be designed so that they can be tested in this mode. The present disclosure is directed to a method of designing the chip, simulating its testing, developing test vectors, and actually testing the chip.

It is clear that it is desirable to power down as much of the chip as possible during physical testing so as to minimize power consumption. Hence some power domains will be on and others will be off. However the problem is not that simple since even within particular power domains which are powered down there may be portions which need to be powered up during testing, as further explained below. The discrepancy between testing and actual functional operation of the chip is further exacerbated by the fact that during typical chip operation (typical operating modes) due to powering down only about 15% to 25% of the gates of the chip are powered up. However in prior art testing mode this may be as high as 50%, which creates problems with excess power consumption.

Note that while the description here is typically of the above type of manufacturing or structure testing, it also is applicable to so-called functional testing of ICs. The relevant test signals generated by the ATPG are also referred to as test vectors. Moreover there is the well known concept of scan testing which uses chains of scan in/scan out test registers or latches on the chip which are memory elements used to deterministically read in and read out signals to the internal circuitry of the chip and to/from internal chip nodes which are the scan registers and as well to/from the chip pins (input/output terminals).

ATPG employs a "model" (a "test model") used to test the operation of an integrated circuit. The present method proposes a test mode that acts as a filter on the model. In accordance with the present method, certain parts of the chip are powered down during testing. These correspond to parts of the chip that can be powered down during normal (functional) operation. The problem (see above) is that during ATPG test, an IC or die typically uses more power than the actual completed IC uses because in typical ATPG, there is no power-down, but in actual operation of low power ICs there is power-down. Thus, typical prior art ATPG risks destroying the IC or die due to excessive heat dissipation.

In addition, during typical ATPG in which there is an excessive register shifting or gate switching, the chip may suffer the power-droop because the chip does not have sufficient electric current needed to supply all of that switching functionality. Therefore, power-droop may result in inaccurate ATPG test results due to such power-droop rather than due to an actual faulty IC design or fabrication.

Hence in accordance with the invention during IC design one maps (associates), using e.g. a tool that specifies the power specifications of an IC design, the test modes to the power modes. The system in accordance with the invention allows one to determine if the mapping is valid and if it results in a valid test mode. This then allows one to develop the proper ATPG test vectors so as to test only the active logic (gates or other on-chip circuitry) and ignore any false results of inactive logic. Hence the testing approach in accordance with this invention targets the logic which is powered up at any one time only and thereby does not involve the powered down logic. Hence in one version the present method is embodied in particular test vectors generated by a computer program, and the test vectors are then applied to a chip in the actual testing. Typically the computer program is coded in a computer language such as for instance C or C++ or scripting TCL but not so limited.

Using the Common Power Format File Directives to identify the powered and unpowered logic present in an IC, design allows ATPG (automatic test pattern generation) to effectively target faults for tests under the various power configurations allowed. The present method ensures that the power conditions required to excite and observe the faults exist for the power conditions that are applied during, e.g., manufacturing tests. By automatically partitioning the faults to remove those that cannot be excited or observed during test, the testability of the partition of the device will reflect the power state of the logic gates or elements. Additionally, the isolation of signals in powered logic from signals originating in unpowered logic will be evaluated and ATPG will effectively avoid generation of patterns which observe such contaminated signals.

In one embodiment, the present method is used specifically prior to the actual test vector generation process (ATPG) being executed. The method receives as data the power related constraints and constructs (e.g., power domains and modes) and abstracts this data so that the otherwise ATPG tool (software) can operate on its database relating to a particular IC design, data structures, and algorithms without requiring any explicit consideration otherwise of the power related aspects. Conventionally the resulting test vectors are then applied during actual IC testing to the chip input pins and/or scan registers, and the resulting IC response is observed at the chip output pins and/or scan register outputs. Hence advantageously in one embodiment this method requires minimal changes to conventional ATPG.

DETAILED DESCRIPTION

Figure 1:
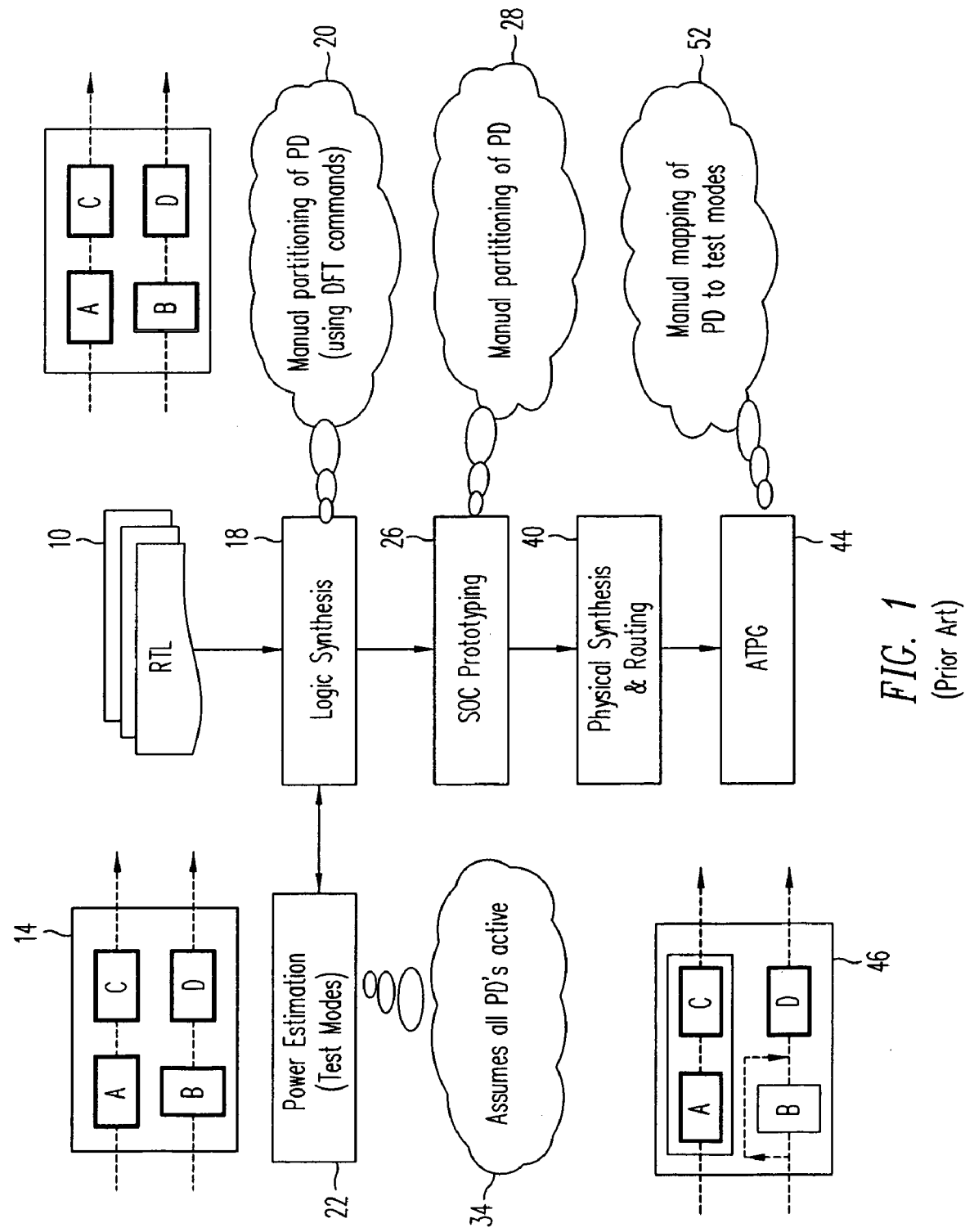
FIG. 1 shows a flowchart of a conventional method.

This disclosure relates in part to the Common Power Format, which is a known circuit design tool (software) directed towards low power circuits, including testing thereof, and especially intended for circuits having complex power domains and operating modes. See also U.S. patent application Ser. No. 11/489,384, filed Jul. 18, 2006, title "Method and System for Simulating State Retention of an RTL Design, Yonghao CHEN, and Ser. No. 11/489,385, filed Jul. 18, 2006, title "Simulation of Power Domain Isolation", Yonghao CHEN, both incorporated herein by reference in their entireties. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the description that follows are presented in terms of pseudo-code or flowcharts, or logic blocks, or other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

In one embodiment, a system for simulating an integrated circuit is conventionally implemented using a computer system. The computer system includes one or more central processing units (CPUs), at least a user interface, a memory device, a system bus, and one or more bus interfaces for connecting the CPU, user interface, memory device, and system bus together. The computer system also includes at least one network interface for communicating with other devices on a computer network. In alternative embodiments, much of the functionality of the circuit simulator may be implemented in one or more application-specific integrated circuits or field-programmable gate arrays, thereby either eliminating the need for a CPU, or reducing the role of the CPU in simulating the integrated circuit.

The memory device may include a high-speed random access memory or may also include a non-volatile memory, such as one or more magnetic disk storage devices. The memory device may also include mass storages that are remotely located from the central processing unit(s). The memory device preferably stores:

an operating system that includes procedures for handling various basic system services and for performing hardware-dependent tasks;

a RTL (register-transfer-language) netlist describing the integrated circuit to be simulated;

a circuit elaborator for compiling the RTL netlist to form a hierarchical simulation data structure;

a hierarchical simulation data structure that represents a data structure of the integrated circuit design to be simulated;

a power information database; and a circuit simulator that simulates the integrated circuit represented by the simulation data structure with power information specifications provided by the power information database.

Note that the circuit elaborator also instantiates circuit components, connects the circuit components, and sets up run-time simulation elements of the integrated circuit design. In addition, the hierarchical simulation data structure represents the integrated circuit design as a hierarchically arranged set of branches, including a root branch and a plurality of other branches logically organized in a graph. The hierarchically arranged set of branches includes a first branch that includes one or more circuit elements and a second branch that includes one or more circuit elements where the first branch and second branch are interconnected in the graph through a third branch at a higher hierarchical level in the graph than the first and second branches. Also note that an RTL netlist description of an integrated circuit may be written in either the Verilog or VHDL design language.

The circuit elaborator, simulation data structure, circuit simulator, power information database, and the RTL netlist may include executable procedures, sub-modules, tables, and other data structures. In other embodiments, additional or different modules and data structures may be used, and some of the modules and/or data structures listed above may not be used.

In accordance with the present invention, since the design intent, power constraint, and/or technology library information are embedded within the CPF (Common Power Format) file in some embodiments, operations such as verification and sign-off processing are possible even at the functional stage. In fact, the information can be used throughout the entire EDA tool work flow to more efficiently and effectively allow the circuit designer to design, verify, and physically implement the design.

In an exemplary implementation of CPF and in accordance with this disclosure, "CPF objects" refer to objects that are being defined (named) in a CPF file. The following are examples of CPF objects used in CPF according to some embodiments each corresponding to an aspect of the circuit being designed and later tested:

Operating Condition or Value: A condition determined through a specific set of process, voltage and temperature values under which the design must be able to perform.

Power Domain: A collection of logic blocks (hierarchical instances) and "leaf instances" that use the same power supply during normal operation, and that can be powered on or off at the same time for an operation. A leaf instance is the smallest unit of a logic block such as a logic gate, flip-flop, latch, and other type of storage elements. Power domains follow the circuit logic hierarchy. They can be nested within another power domain. A virtual domain is a power domain inside an IP block instance. IP block in this field refers to an off-the-shelf portion of an IC design such as a floating point arithmetic unit that is integrated into a larger design. An IP block may have multiple supply and voltage domains. A virtual domain can only be associated with a list of I/O ports (terminals) of the IP block. In some embodiments, one cannot declare instances that belong to different logic hierarchies to be part of the same power domain.

Power Mode: A static state of a circuit design that indicates the ON and OFF status of each power domain.

In some embodiments, special library cells for power management are provided. The following are examples of library cells that can be used in some embodiments:

Always-on Cell: A special buffer or latch or flip-flop located in a powered down domain, and whose power supply is continuously on even when the power supply for the rest of the logic in the power domain is off.

Isolation Cell: Logic used to isolate signals between two power domains where one is powered on and one is powered down. The most common usage of such cell is to isolate signals originating in a power domain that is being powered down, from the power domain that receives these signals and that remains powered on.

State Retention Cell: Special flip-flop or latch used to retain the state of the cell when its main power supply is shut off.

In some embodiments, CPF can be implemented hierarchically. For example, design teams can contribute to different blocks in the design. These blocks, whether they are "soft" blocks or "hard" blocks (such as IP instances, where the internal details of the block are unknown) can each have their own CPF file.

FIG. 1 shows a conventional (prior art) approach (flow chart) to designing an IC having a plurality of power domains (PD). This generally is carried out by commercially available (software) design tools, such as the RTL compiler from Cadence Design, Inc. The RTL (register transfer language) net list 10 describing the circuit is provided conventionally. This includes a set of hierarchical modules A, C, B, D 14 that contain scan registers as shown (vastly simplified) as well as the remaining conventional IC logic. A logic synthesis 18 is then performed on the RTL net list. Since this design is for a low power IC it is partitioned into (by definition) a plurality of power domains typically done "manually" (by inspection) by one chip designer (a human being) at 20., using DFT (design for test) commands. The RTL compiler design tool also estimates at 22 the power consumption for the chip test mode or modes. Next the SOC (system on chip) chip design prototyping 26 is also performed e.g. by the Encounter™ SOC tool from Cadence Design, accompanied by additional manual partitioning of the power domains 28. Note that as indicated at 32, this approach assumes for the power estimation 22 that all power domains are powered up 34 for the test modes.

The next phase is the conventional chip design physical synthesis and routing (interconnections) 40, followed by the ATPG phase 46. The ATPG phase 46 determines also exactly to which chip nodes (scan registers) each test vector is to be applied and read from at 46. This typically requires additional manual mapping of each power domain each list mode at 52.

Figure 2:
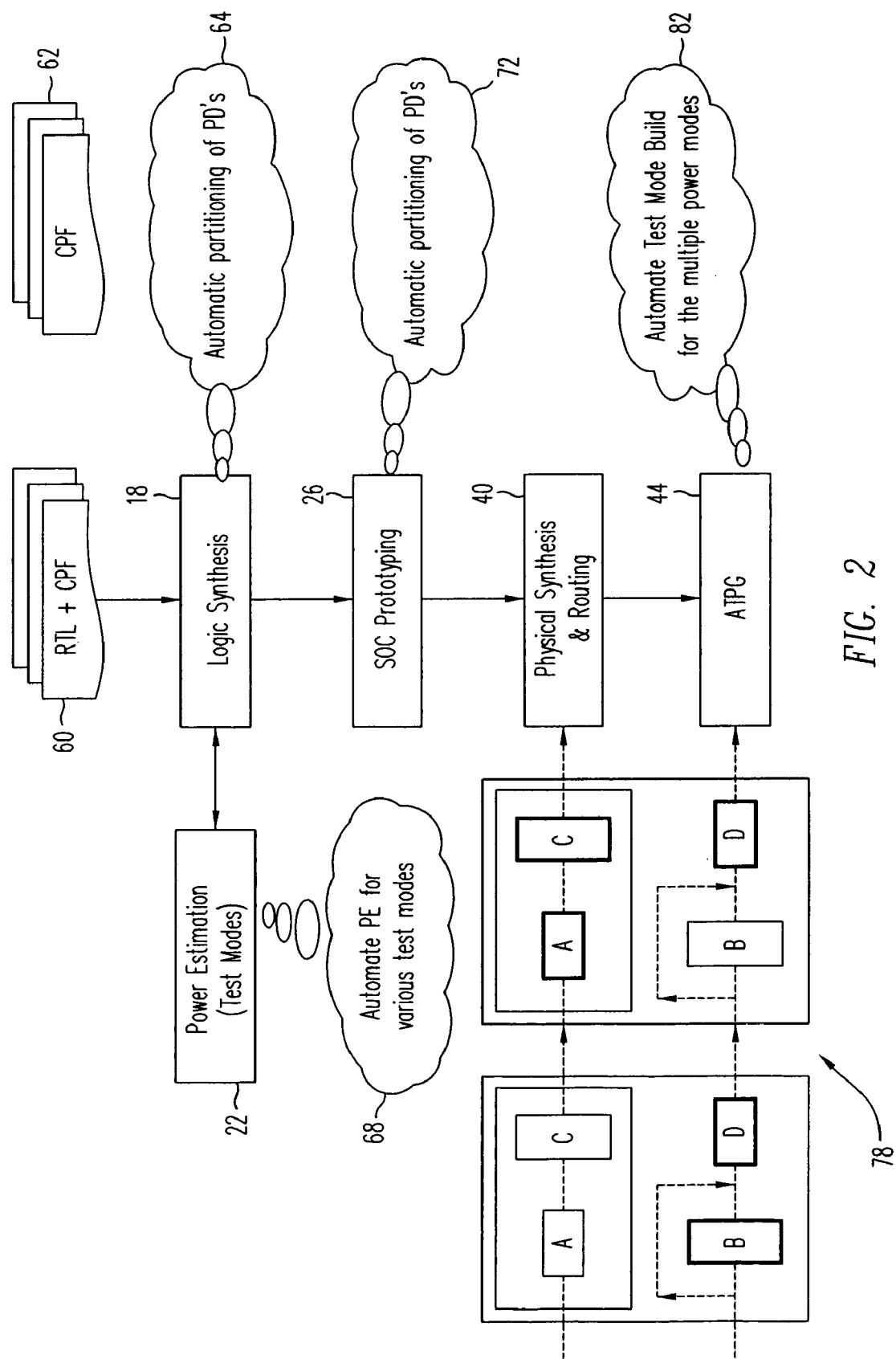
FIG. 2 shows a flowchart of a method in accordance with this disclosure.

The present method different from FIG. 1, as shown in FIG. 2, albeit with common elements having the same reference numbers as in FIG. 1. In FIG. 2, the CPF 62 referred to above is provided, so the method uses the CPF together with the RTL netlist at 60. In the logic synthesis 18, the power domains are automatically partitioned at 64. Further the power estimates 22 are performed by the software at 62, for each test mode. The SOC prototyping 26 is further modified by the automatic power domain partitioning 72.

The ATPG phase 44 draws on the power domain/power mode data of 64 and 72 to automate the creation of test vectors for the multiple power modes at 82. This results in the particular scan chain configurations for different test modes shown at 78 for various test vectors.

Figure 3:
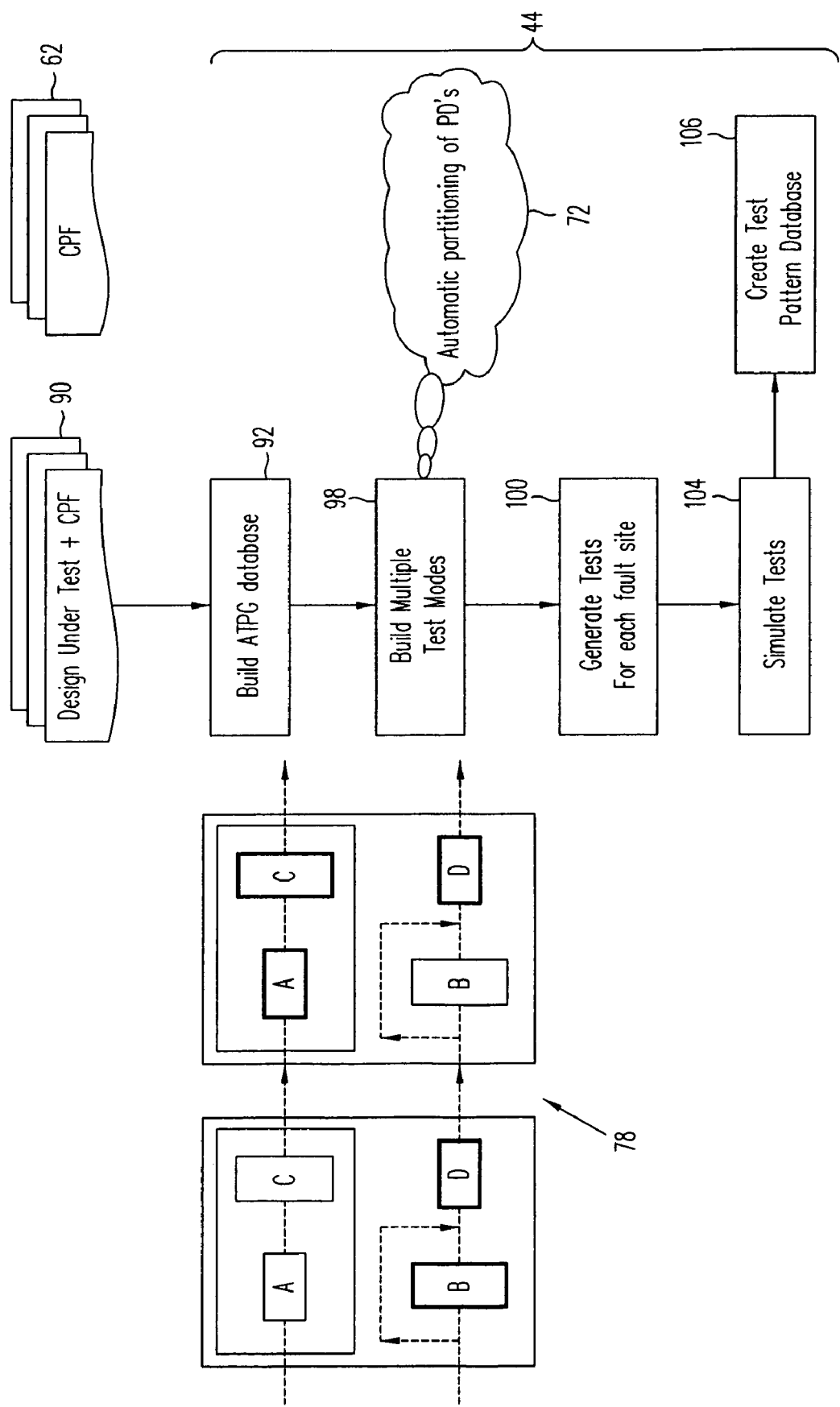
FIG. 3 shows additional detail of the FIG. 2 process.

FIG. 3 shows detail of Step 44 of FIG. 2, in further detail. The design under test with the associated CPF (Common Power Format) 90 is the result of step 4 of FIG. 2. This data is used to construct the ATPG database 92. In turn, this is used to determine the various test modes 98 as embodied by scan chains 78. Test vectors are generated at 100 for each potential fault site (e.g., each gate and/or interconnect) in the chip design. Then at 104 the resulting test vectors are used to simulate chip testing to verify fault site coverage and power consumption in test mode. If the test simulation 104 is satisfactory, the actual test vectors are stored in a database 106 for actual subsequent chip testing.

The following pseudo code process directed to CPF shows in detail a method in accordance with the invention as shown more generally in FIGS. 2 and 3, expressed in terms of the above described circuit elements and modes. In light of this process, the relevant computer code may be readily written in any suitable computer programming language, by one of ordinary skill in the art.

1. When preparing a testmode that is "power aware" read the CPF file that is specified
    1.1. Parse and save the information that identifies each of the power domains specified with a create_power_domain command.
    1.2. Parse and save the information that identifies each of the power modes specified with a create_power_mode command.
    1.3. Parse and save the information that identifies the isolation cells specified with a define_isolation_cell command.
2. Identify the power mode in the CPF file which was designated with a create_power_mode command name that matches the name targeted for use by this testmode.
3. For each power domain that is off in the power mode
    3.1. If no power domain has been defined as "default" do the following:
        3.1.1. If the "off" domains are specified by create_power_mode command option -off_domain:
            3.1.1.1. For each of the "off" domains
                3.1.1.1.1. Identify all the logic within the specified instances (the - instances option of the create_power_domain command) as unpowered.
        3.1.2. Else (the "on" domains are specified by the create_power mode option -on_ domains)
            3.1.2.1. For each of the "on" domains specified:
                3.1.2.1.1. Identify all the logic within the specified instances (the - instances option of the create_power_domain command) as powered.
    3.2. Else
        3.2 1. If the "default" power domain is included in -on_domain option of the create_power_mode command:
            3.2.1.1. For each of the defined power domains (as specified with a create_power_domain command):
                3.2.1.1.1. If that power domain is not included in -on_domain option for the default domain then:
                3.2.1.1.2. For each instances defined for this power domain (the - instances option of the create_power_domain command) identify all logic within the specified instance as unpowered.
        3.2.2. If the "default" power domain is included in -off_domain option of the create_power_mode command:
            3.2.2.1. For each of the defined power domains (as specified with a create_power_domain command):
                3.2.2.1.1. If that power domain is not included in -off_domain option for the default domain then:
                3.2.2.1.2. For each instances defined for this power domain (the - instances option of the create_power_domain command) identify all logic within the specified instance as powered.
4. Identify the logic designated as isolation cells by a define_isolation_cell command in the CPF as powered.
5. Identify the unpowered logic that feeds directly to powered logic as "off domain outputs".
6. Save the unpowered logic identification to the test modes database
7. For each power domain that is off in the power mode
    7.1. Identify the pins and values specified as power domain shutoff conditions. These pins and values are designated with the -shutoff_condition option of the create_power_domain command. Note: if the domain is unpowered the testmode should establish the required value at those pins.
8. Modify the identification of the fixed value latches that are used to establish the test mode base circuit state by removing any unpowered fixed value latches from the list of fixed value latches used by simulation established the testmode base circuit state.

-continued

9. Once the testmode base circuit state has been identified:
   9.1. Verify that any pin required to be at a value by its inclusion in a - shutoff
        _condition option for a power domain that has been identified as unpowered in
        this power mode is at the designated value when the testmode base circuit state is
        applied.
10. Active Logic Identification
    10.1. Mark node that is fully contained within an unpowered block as inactive.
    10.2. Mark any node that only feeds to unpowered logic as inactive.
        Note: by marking unpowered logic as inactive the faults associated with the
        unpowered logic are not targeted in this test mode thus avoiding the generation of
        invalid tests by ATPG.
11. Test Structure Identification
    11.1. Stop all test structure tracing/identification if unpowered logic is encountered thus
        avoiding scan chains that traverse unpowered logic.
12. Test Structure Validation
    12.1. The outputs of unpowered domains are checked to verify that signals originating
        in the unpowered domains are blocked from propagate to observable logic.

The following explains the above pseudo-code process in additional detail, including actual commands and code in the Encounter™ Test (ET) environment. The pertinent application is build_testmode. This imports a CPF (Common Power Format), file used to understand user intent:

CPFinput=<filename>

The testmode targets a power mode to mimic:

Power_Mode=<power_mode_name>

The power mode names can be extracted from the CPF file. Benefits of this include minimizing overall power consumption during test; CPF provides a basic structure for managing power during test by understanding the designs power structure, it shows controlling factors for power mode stabilization, and ATPG can now target, or avoid, powered down domains.

Power aware scan chains can be built using power-domain bypassing. One constructs the same number of scan chains through each power domain (e.g., 32 scan chains). One connects the segments of the chain in series, with scan chains going through every power domain. One adds to the circuit design a bypass mux (multiplexer) from scan-in to scan-out for each power domain controlled with power switch enable. When the "Power Off" condition obtains for a particular Power Domain, the condition is "true" that the muxes are set to bypass those power domains.

Figure 4:
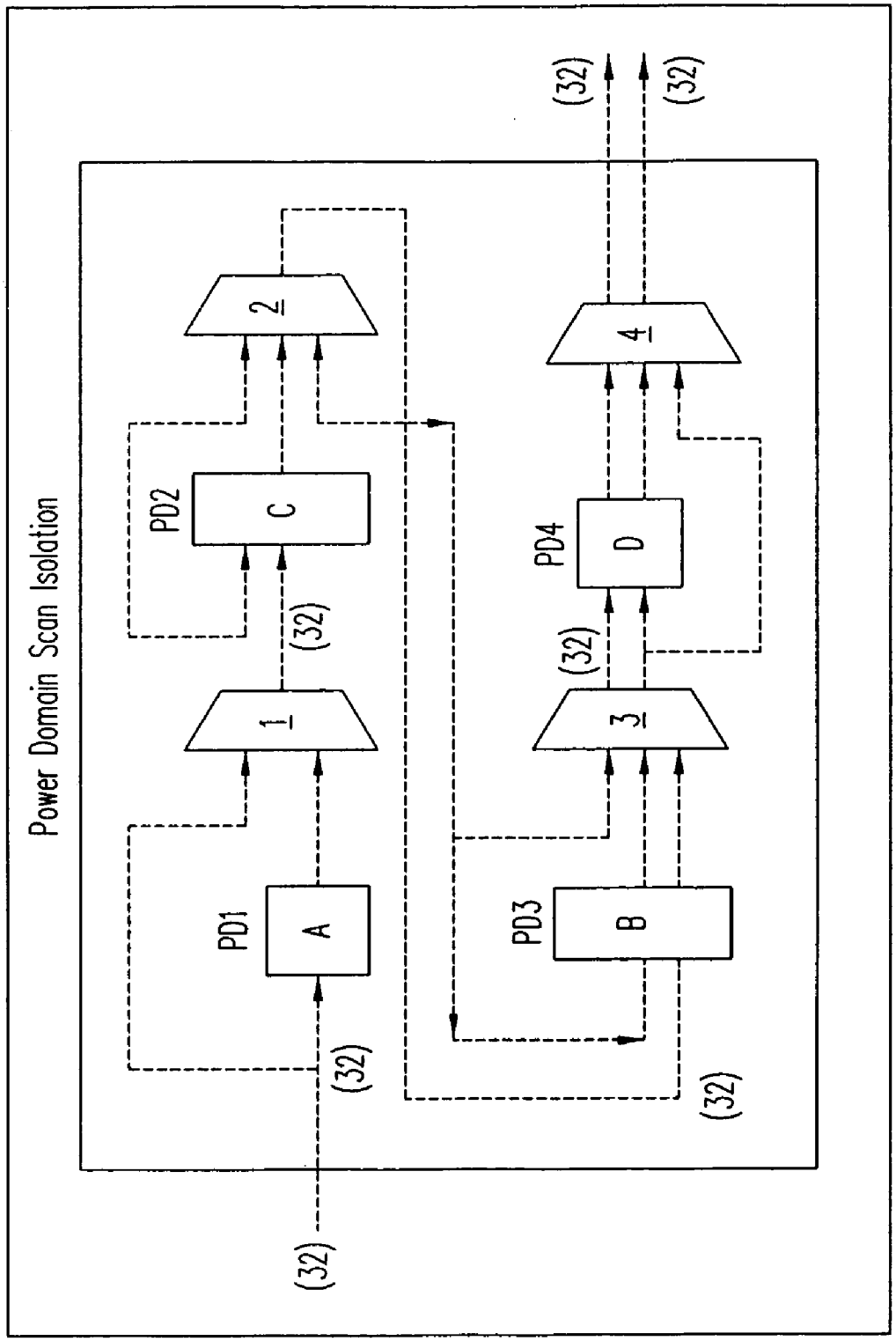
FIG. 4 shows power domain scan isolation.

See the FIG. 4 example of a circuit for testing domains B and C in isolation where each power domain is designated by PD and A, B, C, and D each refer to a power domain instance.

1. Power Off domains here are A and D, and Power On domains are B and C

2. Muxes 1 and 4 are in bypass mode, and Muxes 2 and 3 are in pass-thru mode.

Figure 5:
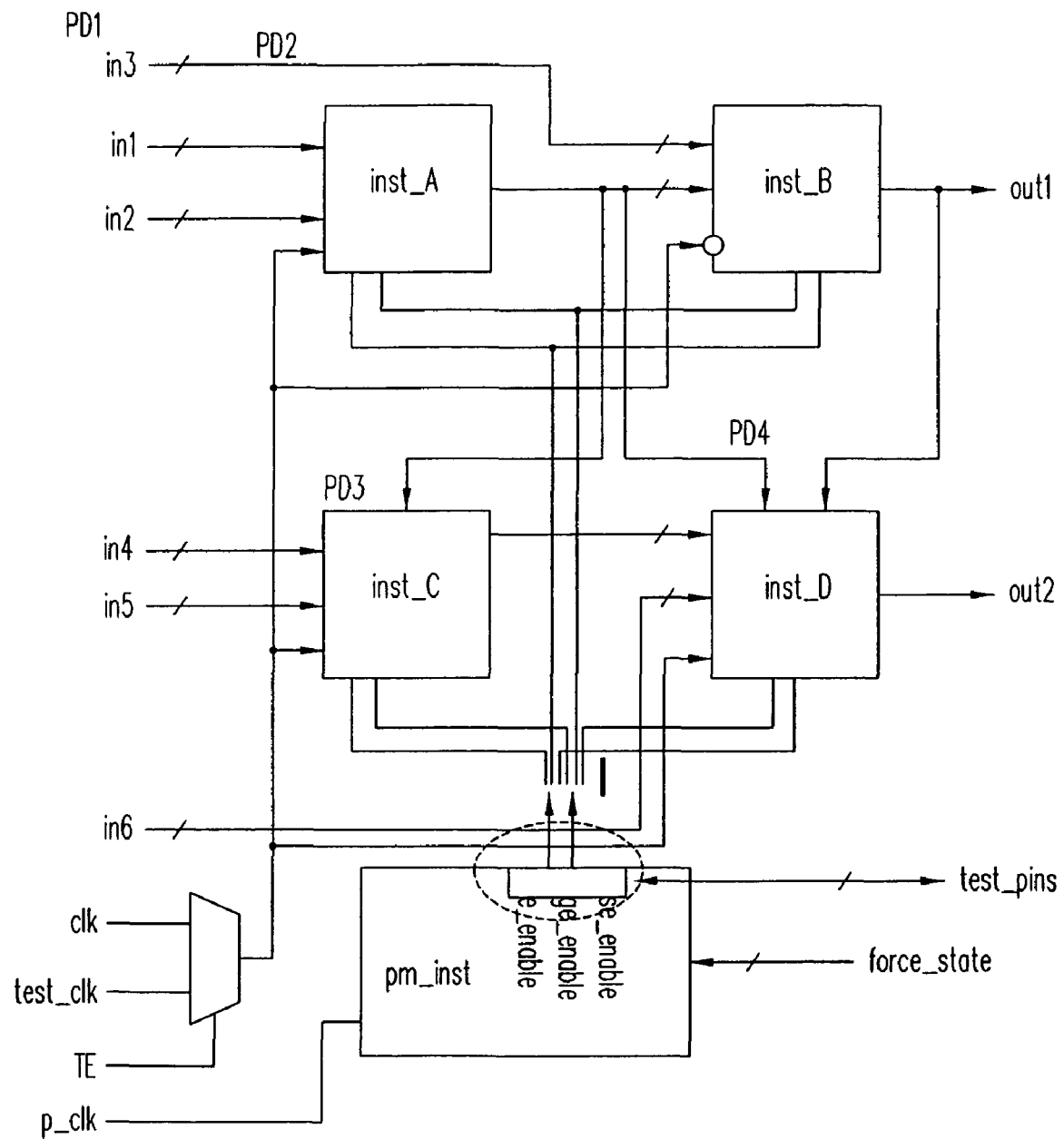
FIG. 5 shows further power domain scan isolation.

Traditionally testing has been done with all the power domains powered-on. Improvements in the Encounter™ RTL Compiler allow the power controller circuit to stabilize power modes during test as shown in FIG. 5 (see broken line) which shows the same circuit as FIG. 4 but in more detail. Circuitry on chip for testing including the multiplexers and scan registers thereby enables the selection and stabilization of desired power modes configurations during the test operations.

The selection of power modes (PM) to be mapped to test modes includes at least one instance of each power domain in an "on" condition, to target faults and power domain "enabled" condition verification. It includes at least one instance of each power domain in an "off" condition, to target power domain isolation and "off" condition verification.

For example see the following code for the case for power modes PM1, PM2 and PM3 where PM4 is not needed for testing:

```
Create_power_mode -name PM1 -sdc_files cm1.sdc -activity_file.../
   SIM/top_1.tcf
Create_power_mode -name PM2 -off_domains {PD2 PD4}
Create_power_mode -name PM3 -off_domains {PD3}
Create_power_mode -name PM4 -off_domains {PD2 PD3 PD4}
```

One checks for PM2 ("off" domains). Next one acquires the power "off" domain list {PD2 PD4} as a local power domain definition. Next one acquires an instance list of power domains, PD2 {inst_A inst_B}, PD4 {inst_D}. This gives a hierarchical instance within the netlist to be marked as inactive.

The shutoff condition is then verified (i.e. for PD2) as follows:

pm_inst/pse_enable[0] pin is "true"

pm_inst/pse_enable[0] pin state must be satisfied by mode initialization pin conditions Failure to meet the condition results in test mode build failure. Then one does the same for PD4 as shown by the following code:

```
Create_power_domain -name PD1 -default_domain top
Create_power_domain -name PD2 -instance_list {inst_A inst_B}
   -shutoff_condition {pm_inst/pse_enable[0]}
Create_power_domain -name PD3 -instance_list inst_C
   -shutoff_condition {pm_inst/pse_enable[1]}
Create_power_domain -name PD4 -instance_list inst_D
   -shutoff_condition {pm_inst/pse_enable[2]}
```

To define a power mode for test, first one checks for PM2 ("on" domains).

One acquires the power "on" domains, where PD3 is the only switchable domain left for the local power domain definition. Then the "On" condition is verified:

pm_inst/pin_PD3 pin is "true"

pm_inst/pin_PD3 pin state must be satisfied by mode initialization pin conditions Failure to meet the required condition results in test mode build failure.

If create_power_switch_logic is not specified, checks will not occur, see the following code:

```
Create_power_switch_logic -power_domain
PD2 -enable_high_out pm_inst/pin_PD2
Create_power_switch_logic -power_domain
PD2 -enable_high_out pm_inst/pin_PD3
Create_power_switch_logic -power_domain
PD2 -enable_high_out pm_inst/pin_PD4
```

Handling isolation for PD2 is as follows:

One acquires the cells list using the command define_isolation_cell:

{LVLHLEHX* LVLLHEHX* LVLHLELX*}
{ISOLN*}

For hierarchical instances being shutdown, for PD2 they are { inst_A inst_B }.

All cells defined in the hierarchical instances that are identified as being in isolation will be added back into the hierarchical instance; treated as active logic; and simulated to determine isolation behavior.

Another statement used for adding cells back in to the shut down power domains is:

define_always_on_cell, as used in the following code:

```
Define_isolation_cell -cells ISOLN* -enable EN -valid_location to
Define_isolation_cell -cells
"LVLHLEHX* LVLLHEHX* LVLHLELX*" -enable EN
Define_always_on_cell -cells "ANDX1"
```

The following commands/statements relate to CPF:

```
set_cpf_version
set_top_design
set_scope
create_power_mode
create_power_domain
create_power_switch_logic
create_isolation_logic
define_always_on_cell
define_isolation_cell
define_power_switch_cell
define_state_retention_cell
```

One then assigns a file for the test mode as shown by the following code:

Power_Mode=PM2 which is a keyword to identify power mode

```
assign pin=test_mode test_function= +TI;
assign pin=p_rsttest _function= -SC;
assign pin=reset test_function= -SC;
assign pin==spi_fs test_function= -SC;
assign pin=scan_en test_function= +SE;
assign pin=p_clk test_function= -ES;
assign pin=scan_clk test_function= -ES;
assign pin=scan_in[0] test_function=SI0;
assign pin=scan_out[0] test_function=SO0;
assign pin=scan_in[1] test_function=SI1;
assign pin=scan_out[1] test_function=SO1;
assign pin=scan_in[2] test_function=SI2;
assign pin=scan_out[2] test_function=SO2;
assign pin=PwrTE test_function= +TI;
```

"PM2" is the name defined in the CPF's create_power_mode construct. The Encounter™ Test Guide is a publication explaining the syntax of the test mode definition text file in this embodiment.

The following is the mode initialization file:

```
[Define_Sequence Mode_Initialization_Sequence 1 (modeinit)
[Pattern 1.1 (pattern_type = static);
Event 1.1.1 Stim_PI ( ):
"shift_clock"=0
"PwrTE"=0
"reset"=0
"scan_clk"=0
"scan_en"=1
"shift_sel"=1
"shift_enab"=1
"spi_fs"=0
"test_mode"=1;
]Pattern 1.1;
[Pattern 1.2 (pattern_type = static);
Event 1.2.1 Pulse ( ):
"scan_clk"=+;
]Patter 1.2;
[Pattern 1.3 (pattern_type = static);
Event 1.3.1 Stim_PI ( ):
"shift_input"=1;
Event 1.3.2 Pulse ( ):
(A shift in value of '1' sets that power domain to a "power on" state.)
"shift_clock"=+;
]Pattern 1.3;
[Pattern 1.1 (pattern_type = sttic);
Event 1.1.1 Stim_PI ( ):
"shift_sel"=0
"shift_enab"=0
"PwrTE"=1;
]Pattern 1.1;
]Define_Sequence Mode_Initialization_Sequence 1; The syntax of
the test mode initialization file is explained in the publication
Encounter ™ Test User Guide in this embodiment.
```

This example has only one power switch enable to control.

The test mode is built as follows (see the Encounter™ Test User Guide to explain the syntax of this command for one embodiment.):

```
build_testmode \
testmode=PM2 \
modedef=FULLSCAN \
cpffile=$DemoDir/CPF/DTMF.cpf\
assignfile=$DemoDir/assignfiles/
dtmf_recvr_cor_gate.FULLSCAN.PM2 \
modedefpath=$DemoDir/install/modedef \
tdrpath=$DemoDir/install/tdr \
seqdef=$DemoDir/modeinit/TBDseqPatt.PM2.modeinit \
>$DemoDir/logs/build_testmode.out.PM2 2>&1
```

The cpffile keyword points to the CPF file that is used for this IC design. All information needed to understand the power mode can then be extracted from the CPF definition.

Figure 6:
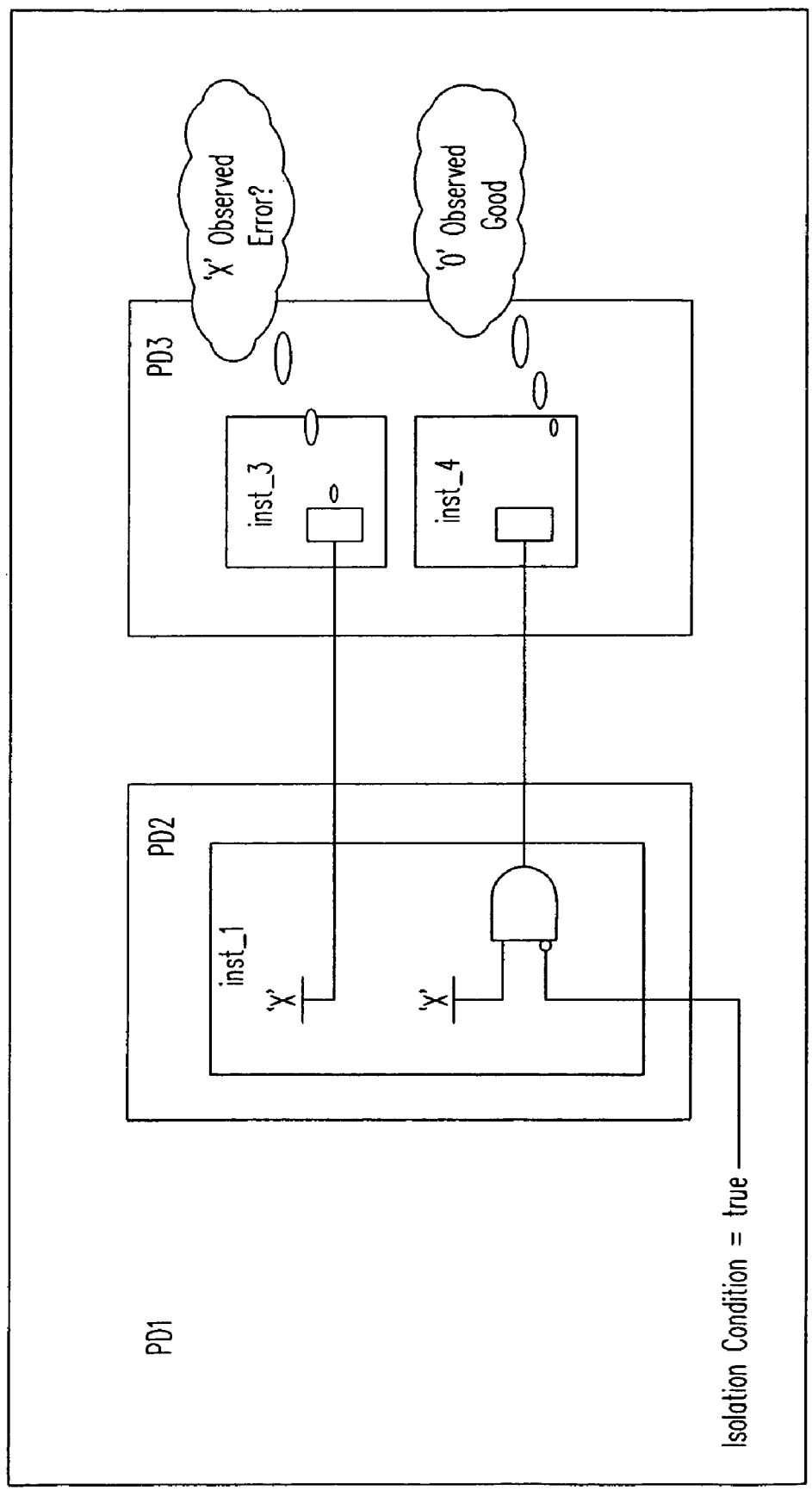
FIG. 6 shows power domain error observation.

The test mode is verified by 'X' source identification. Within hierarchical instances identified as powered off, all outputs if fed by inactive logic are tied to 'X', any active logic's inputs fed by inactive logic are tied to 'X', and any active logic driving inactive logic will be left dangling, see FIG. 6. Dangling in this context means having an undefined or X-value. As well known in this field, powered down logic sources lead to an electrical condition where it is impossible to predict how the associated sink logic will interpret incoming logic values (from the powered down logic sources.) The ATPGT and simulation tools treat these values as unknown or value "X". X values can be ignored if all the test responses are fully observable such as when all the scan chain test response data is scanned out and measured by a tester. If on-chip test response compression is used, then the X-states lead to the incorrect calculation of the compressed signature. The signature is a compressed version of the large amount of test data.

For the scan chains, for each test mode, valid scan chains are identified and tested for integrity. Bypass capability, if selected, is examined for effective isolation. Each scan chain must bypass any powered 'off' domains and not pass through them. Compression, if selected, will be examined for proper isolation. Power "off" domains must be isolated so as to not contaminate the signature. For stable test modes, for each test mode stability of the test mode is examined (1) at the power enable signals; (2) at the isolation enable signals when the power domain is powered "off"; and (3) at the scan clocks. As known in the field, in a stable test mode all sources of the test stimuli such as chip primary inputs and scan chain elements are at a stable (non-transient) state prior to the launch of the test stimuli by the application of chip clock signals. It is important to ensure stability prior to the launch-capture phase of the test application.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

We claim:

1. A computer enabled method of simulating a circuit, the circuit including a plurality of power domains including a plurality of logic blocks of the circuit design each power domain having an associated supply of electrical power and an associated operating voltage, each power domain capable of being powered down/up independent of the other power domains in a particular mode of operation of the circuit, the method comprising the acts of:
   providing in a storage device an power information database,
   identifying each power domain of the circuit,
   identifying each mode of operation of the circuit, each mode indicating the ON and OFF status of each power domain,
   identifying a particular mode of operation (test mode) associated with testing the circuit;
   for each power domain that is powered down in the test mode, designating the logic elements in that power domain as being powered down;
   for each power domain that is powered up in the test mode, designating the logic elements in that power domain as being powered up;
   storing the powered down/up designations of the logic elements in a storage device; and
   using a computer to generate a plurality of test patterns from the stored powered down/up designations that do not target logic elements that are powered down and that do target logic elements that are powered up.

2. The method of claim 1, wherein each mode is a power mode of the circuit design.

3. The method of claim 1, further comprising the acts of:
   identifying at least one logic element in one of the power domains otherwise powered down as being an isolation cell isolated; and
   designating the isolation cell isolated element as being powered up in the test mode.

4. The method of claim 3,
   wherein the isolation cell is a logic cell that isolates signals between two power domains of the circuit when a first of the power domains is powered down and the second is powered up.

5. The method of claim 1, further comprising the acts of:
   identifying logic elements in the circuit that are designated as powered down and which directly supply signals to a logic element that is designated as powered up in the test mode.

6. The method of claim 1, further comprising the acts of:
   for each power domain that is designated as powered down in the test mode, identifying associated input and output terminals of the power domain and electrical values associated with each such terminal; and
   designating each such terminal and electrical value as being in an unpowered condition in the test mode.

7. The method of claim 1, further comprising the acts of:
   identifying memory elements in the circuit associated with the test mode;
   determining which of the identified memory elements are designated as powered down in the test mode; and
   saving the identification of the so-determined memory elements.

8. The method of claim 6, further comprising the acts of:
   verifying that any terminal so designated as being in an unpowered condition is at a predetermined electrical value.

9. The method of claim 1, further comprising the acts of:
   identifying circuit nodes in each logic element designated as powered down in the test mode; and
   identifying each such node as being inactive in the test mode thereby rendering faults associated with such a node to not being considered.

10. The method of claim 9, further comprising the acts of:
    identifying circuit nodes in each logic element designated as powered up in the test mode;

determining which of the so-identified circuit nodes only supply signals to a logic element designated as powered down; and identifying each such determined node as being inactive.

11. The method of claim 1, further comprising the acts of:

establishing a chain of test elements in the circuit for the test mode;

tracing a signal flow through the chain; and interrupting the tracing upon encountering a logic element in the chain designated as powered down in the test mode.

12. The method of claim 11, wherein the test elements are test scan elements.

13. The method of claim 1, further comprising the acts of:

identifying output terminals of the power domains that are powered down in the test mode; and verifying that any signals from the identified output terminals are blocked from propagating to logic elements in another power domain of the circuit designated as powered up.

14. The method of claim 1, further comprising, in the test mode, simulating applying test signals to the circuit and observing a resulting operation of the circuit.

15. The method of claim 14, wherein the test signals are test patterns.

16. A computer program product for simulating a circuit, the product comprising code for performing the method of claim 1.

17. A programmed computer system arranged for simulating a circuit, and performing the method of claim 1.

18. A system for testing a circuit by applying signals for testing the circuit, the signals being generated by the method of claim 1.

19. A method of testing a circuit, the circuit including a plurality of power domains each having an associated supply of electrical power and an associated operating voltage, each power domain capable of being powered down/up independent of the other power domains in a particular mode of operation of the circuit, the method comprising the acts of:

providing in a storage device an power information database, identifying each power domain of the circuit, identifying each mode of operation of the circuit, each mode indicating the ON and OFF status of each power domain, identifying a particular mode of operation (test mode) associated with testing the circuit;

for each power domain that is powered down in the test mode, designating the logic elements in that power domain as being powered down;

for each power domain that is powered up in the test mode, designating the logic elements in that power domain as being powered up; and storing in a storage device the powered down/up designations of the logic elements;

using a computer to generate test signals from the stored designations:

using a computer to apply the test signals to the circuit.

* * * * *